(12) United States Patent
Okayasu

(10) Patent No.: US 6,285,692 B1
(45) Date of Patent: Sep. 4, 2001

(54) METHOD AND APPARATUS FOR DRIVING LASER DIODE

(75) Inventor: Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/369,046

(22) Filed: Aug. 4, 1999

(30) Foreign Application Priority Data

Aug. 5, 1998 (JP) .................................................. 10-221492

(51) Int. Cl.[7] .......................................................... H01S 3/00
(52) U.S. Cl. .......................................................... 372/38.02
(58) Field of Search ............................................ 372/38.02

(56) References Cited

U.S. PATENT DOCUMENTS

| | | | |
|---|---|---|---|
| 4,709,370 | * 11/1987 | Bednarz et al. | ................. 372/38.02 |
| 5,140,175 | * 8/1992 | Yagi et al. | ........................ 372/38.02 |
| 5,163,063 | * 11/1992 | Yoshikawa et al. | ................... 372/38 |
| 5,283,794 | * 2/1994 | Gibbs et al. | ........................... 372/30 |
| 5,315,650 | * 5/1994 | Tanaka | ............................... 372/38.02 |
| 5,430,749 | * 7/1995 | Horie | ................................ 372/38.02 |
| 6,072,761 | * 6/2000 | Tani | ..................................... 369/116 |

* cited by examiner

*Primary Examiner*—Leon Scott, Jr.
(74) *Attorney, Agent, or Firm*—David N. Lathrop; Gallagher & Lathrop

(57) ABSTRACT

A time measuring unit measures an extinction interval in a drive signal to produce a time signal $-Vdt$ of a level which corresponds to the extinction interval. The time signal is superimposed upon a drive current as a reverse current with respect to a laser diode at the time the current through the laser diode LD rises, thereby rapidly reducing residual carriers in the laser diode to suppress the occurrence of a jitter at the initiation of the light emission.

16 Claims, 11 Drawing Sheets

A  DRIVE CURRENT If

B  DIFFERENTIAL CURRENT Idt

C  If+Idt

METHOD AND APPARATUS FOR DRIVING LASER DIODE

BACKGROUND OF THE INVENTION

The invention relates to a method of driving a laser diode which may be utilized in high rate data transmission or the like, for example, and a driving apparatus using the driving method.

FIG. 11 shows an example of a conventional laser diode driver arrangement in its simplest form. A pair of transistors $Q_1$ and $Q_2$ in differential connection have their emitters connected to a current source Isd in common. A fixed bias voltage Vb is connected to the base of one of the transistors, $Q_2$. Accordingly, the transistors $Q_1$ and $Q_2$ operate as switching elements in a manner such that when one of them is turned on, the other is turned off. In the example shown, a laser diode LD is connected to the collector of the transistor $Q_1$, the base of which is connected with an input terminal $T_{IN}$ which is fed with a pulse drive signal $V_{IN}$ of a positive polarity. Each time a pulse in the signal $V_{IN}$ rises to assume a high level, the transistor $Q_1$ is turned on to cause a light emission from the laser diode LD, thus radiating radiation $P_{OUT}$. When the pulse applied to the input terminal $T_{IN}$ falls, the transistors $Q_1$ is turned off, while the transistor Q2 is turned on. The pair of transistors $Q_1$ and $Q_2$ are turned on and off in a differential manner to achieve a high rate switching operation.

In FIG. 12, there is illustrated a relationship between the current If passing through the laser diode LD and an output radiation $P_{OUT}$, which are depicted at A and B, respectively. A flow of bias current Ib which is close to an emission initiating current Ith is maintained through the laser diode LD by a current source Isb. A sophistication is made such that as soon as the transistors $Q_1$ is turned on, the drive current If immediately exceeds the emission initiating current Ith, thus minimizing a lag in the light emission. The drive current If is shown at A in FIG. 12 while a response of radiation $P_{OUT}$ is shown at B in FIG. 12. A lag of radiation $P_{OUT}$ with respect to the rising and the falling edge of the drive current If is shown exaggerated at $T_{DLY(ON)}$ and $T_{DLY(OFF)}$ as will be noted in the graph B of FIG. 12.

A lag in the termination of radiation $P_{OUT}$ is attributable to the fact that a carrier concentration which remains in the active layer of the laser diode LD fails to return to zero rapidly when the drive voltage is interrupted. A difficulty that is caused by the lag in reducing the carrier concentration is illustrated in FIG. 13

For example, as illustrated in FIG. 13A, as the OFF interval $T_1$ of the drive current $I^f$ or the extinction interval becomes shortened, the drive current $I_f$ would begin to flow at a timing when the carrier concentration is not reduced sufficiently, as shown in FIG. 13B, the time interval $T_{DLY(ON)}$ until the next emission is reached would be shorter or $T_{DLY(ON1)} > T_{DLY(ON2)}$, as illustrated in FIG. 13C. In the example shown in FIG. 2, it is longer again in the OFF interval $T_2$, whereby the delay of the emission with respect to the immediately following rising edge of the drive current, or $T_{DLY(ON3)}$, is longer than $T_{DLY(ON2)}$. This means that a jitter is produced depending on the length of the extinction period $T_{OFF}$, and the occurrence of a jitter presents a fault to the high rate transmission in a disadvantageous manner. This problem is discussed in"Effect of Bit-Rate, Bias and Threshold Currents on Turn-on Timing Jitter in Lasers Modulated with Uncoded and Coded Waveforms," IEEE Photonics Technology Letters, Vol. 8, No. 3, March 1996, pp 461–463. This literature indicates that the turn-on time $T_{ON}$ of the laser diode LD after extinction period $T_{OFF}$ is given as follows:

$$T_{ON} = \tau \ln\left\{1 + \frac{Ith - Ib}{Im - Ith}[1 - \exp(-T_{OFF}/\tau)]\right\} \quad (1)$$

where $\tau$ represents a residual carrier concentration (carrier lifetime) in the active layer of the laser diode LD. FIG. 14 shows the relationship as represented by the equation (1) where turn-on time $T_{ON}$ and the extinction period $T_{OFF}$ are normalized with $\tau$, respectively. Curves 12A, 12B and 12C depicted in FIG. 12 correspond to values of Im which are equal to 2Ith, 3Ith and 4Ith, respectively, for Ib=0.5 Ith. It will be seen from FIG. 14 that the turn-on time $T_{ON}$ varies with the extinction period $T_{OFF}$ for a range of $T_{OFF}$ from 0 to nearly three of four times $\tau$, but remains constant for any subsequent change in the extinction period $T_{OFF}$. The lifetime $\tau$ of residual carriers of a laser diode is usually on the order of 2 to 3 ns, and thus it is seen that if a time interval from a preceding pulse is less than 10 ns, a jitter occurs unavoidably. However, the jitter itself (or $T_{ON}$) can be reduced if the drive current If is increased.

SUMMARY OF THE INVENTION

It is an object of the invention to provide a method of driving a laser diode which is capable of suppressing the occurrence of a jitter and a laser diode driver arrangement which utilizes the driving method.

An apparatus for driving a laser diode according to a first aspect of the invention comprises:

a laser diode;

power supply means for supplying a driving power to the laser diode;

switching means connected in series with the laser diode for controlling a drive current which passes through the laser diode in accordance with a drive signal which repeats an ON and an OFF interval to switch the laser diode between a light emission and an extinction;

time measuring means for measuring the OFF interval of the drive signal and delivering a time signal having a level which corresponds to the interval; and current control means for controlling the drive current in accordance with a control signal which corresponds to the time signal such that the shorter the OFF interval, the longer the rising of the drive current is retarded.

An apparatus for driving a laser diode according to a second aspect of the invention comprises:

a laser diode;

power supply means for supplying a driving power to the laser diode;

switching means connected in series with the laser diode for controlling a drive current which passes through the laser diode in accordance with a drive signal to switch the laser diode between a light emission and an extinction; and differential current generating means for generating a differential current from the drive signal and for superimposing the differential current upon the drive current through the laser diode.

A method of driving a laser diode according to the first aspect of the invention comprises the steps of:

(a) measuring an OFF interval in the drive signal and producing a time signal of a level which corresponds to the OFF interval; and (b) controlling the drive current on the basis of the time signal such that the shorter the measured interval, the longer the rising time which the drive current is retarded.

A method of driving a laser diode according to the second aspect of the invention comprises the steps of:

(a) generating a differential current from the drive signal; and (b) superimposing the differential current upon the drive current so that the differential current from the falling edge of the drive current is effective in reducing residual carriers.

With the method and apparatus for driving a laser diode according to the invention, the shorter the time interval since a preceding drive current has been interrupted, the greater the magnitude of a reverse current that is superimposed upon the drive current at the next time the drive current rises. In this manner, the next emission is controlled to be occurring in a retarded direction. Consequently, a rising of the emission is restricted, affording an advantage that the occurrence of a jitter in the data that is optically transmitted is suppressed.

DETAILED DESCRIPTION OF PREFERRED EMBODIMENTS

Figure 1:
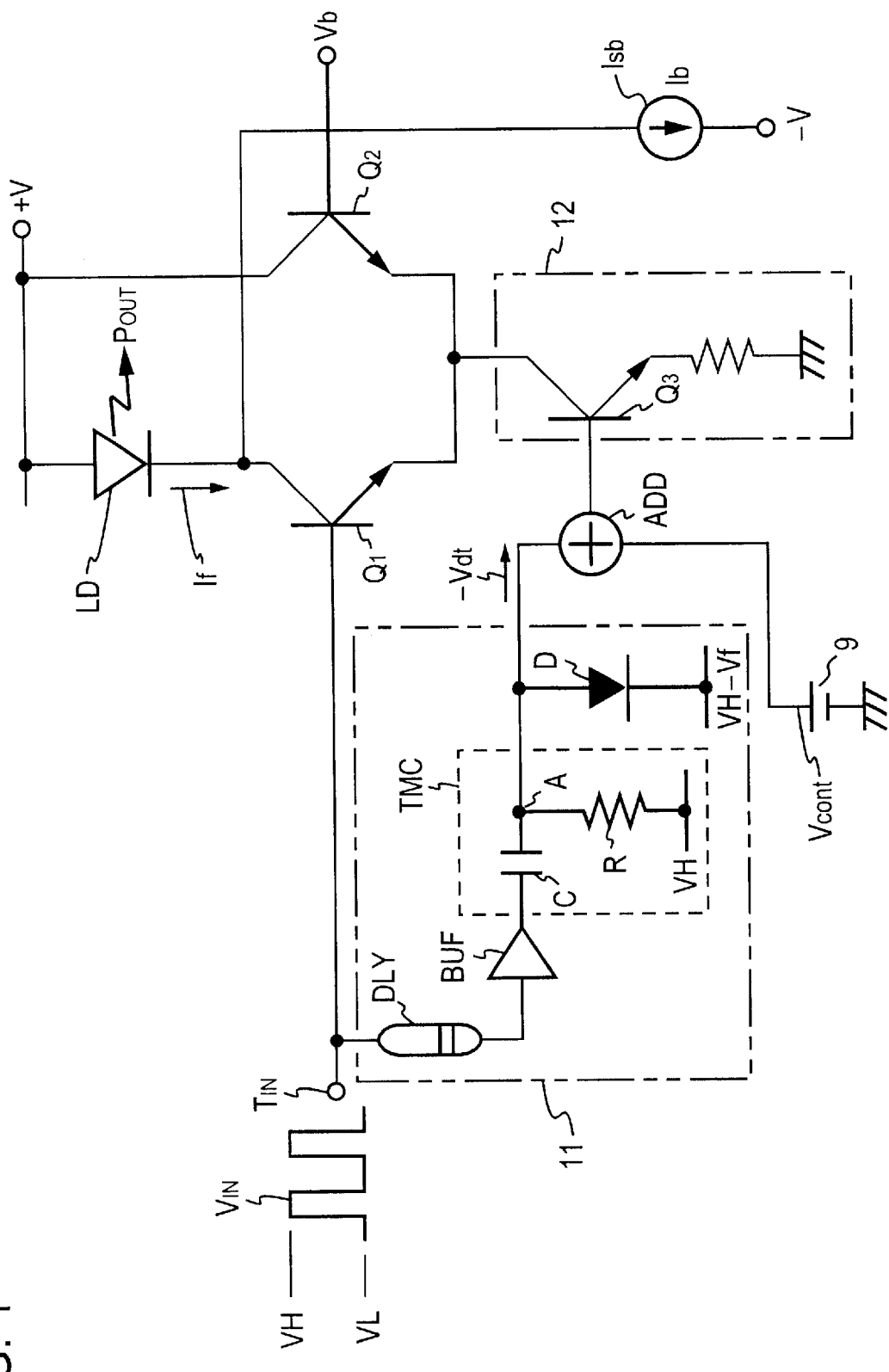
FIG. 1 is a circuit diagram illustrating a first embodiment of the invention.
Figure 11:
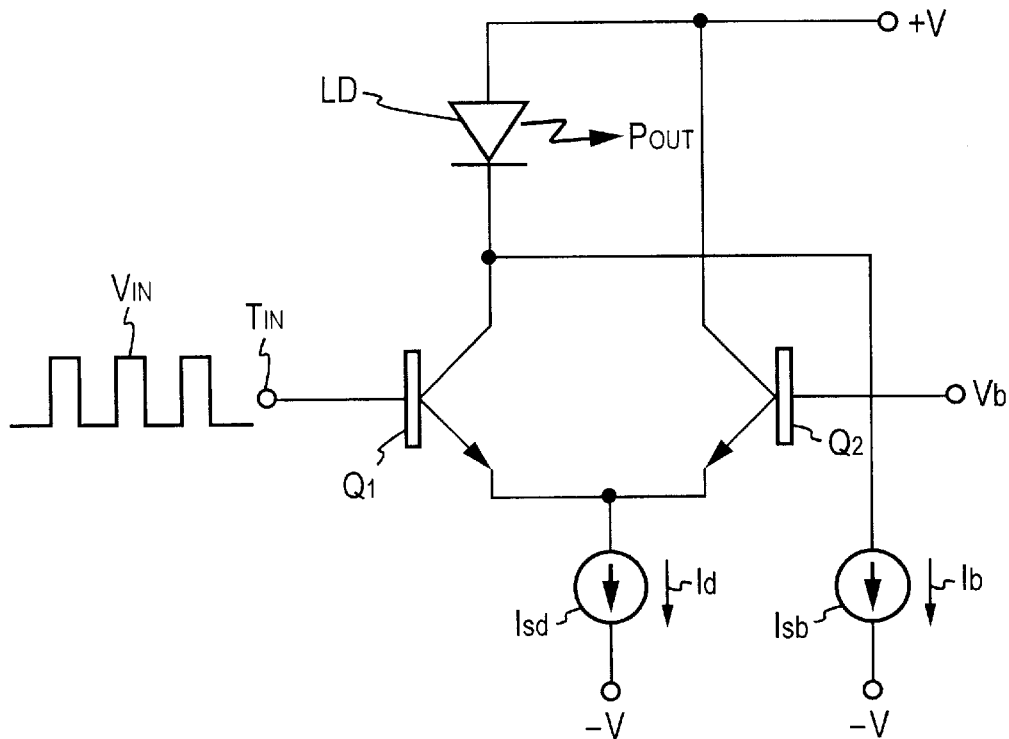
FIG. 11 is a circuit diagram illustrating a prior art.
Figure 12:
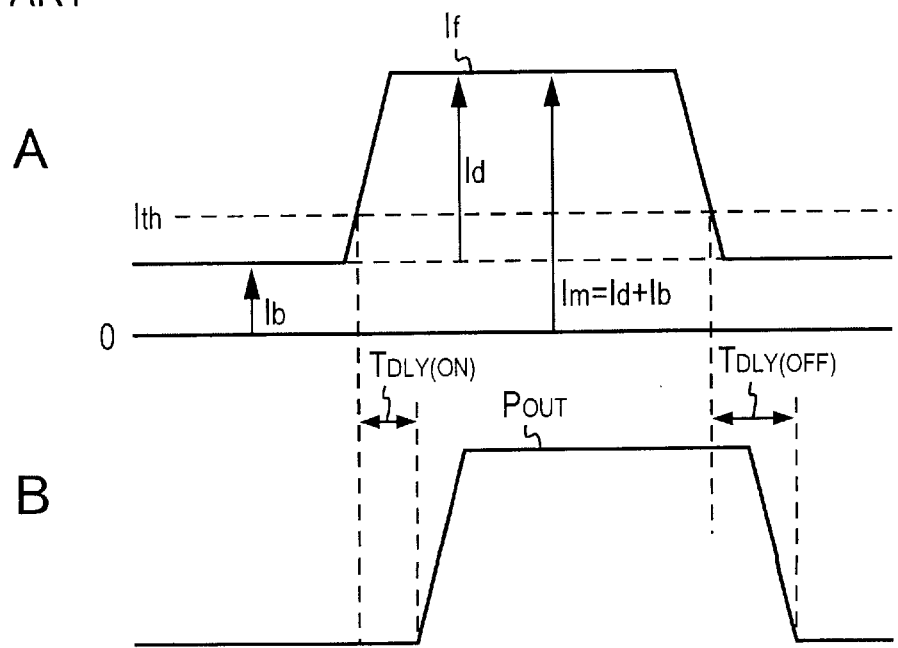
FIG. 12 are waveform diagrams illustrating the operation of FIG. 11.
Figure 13:
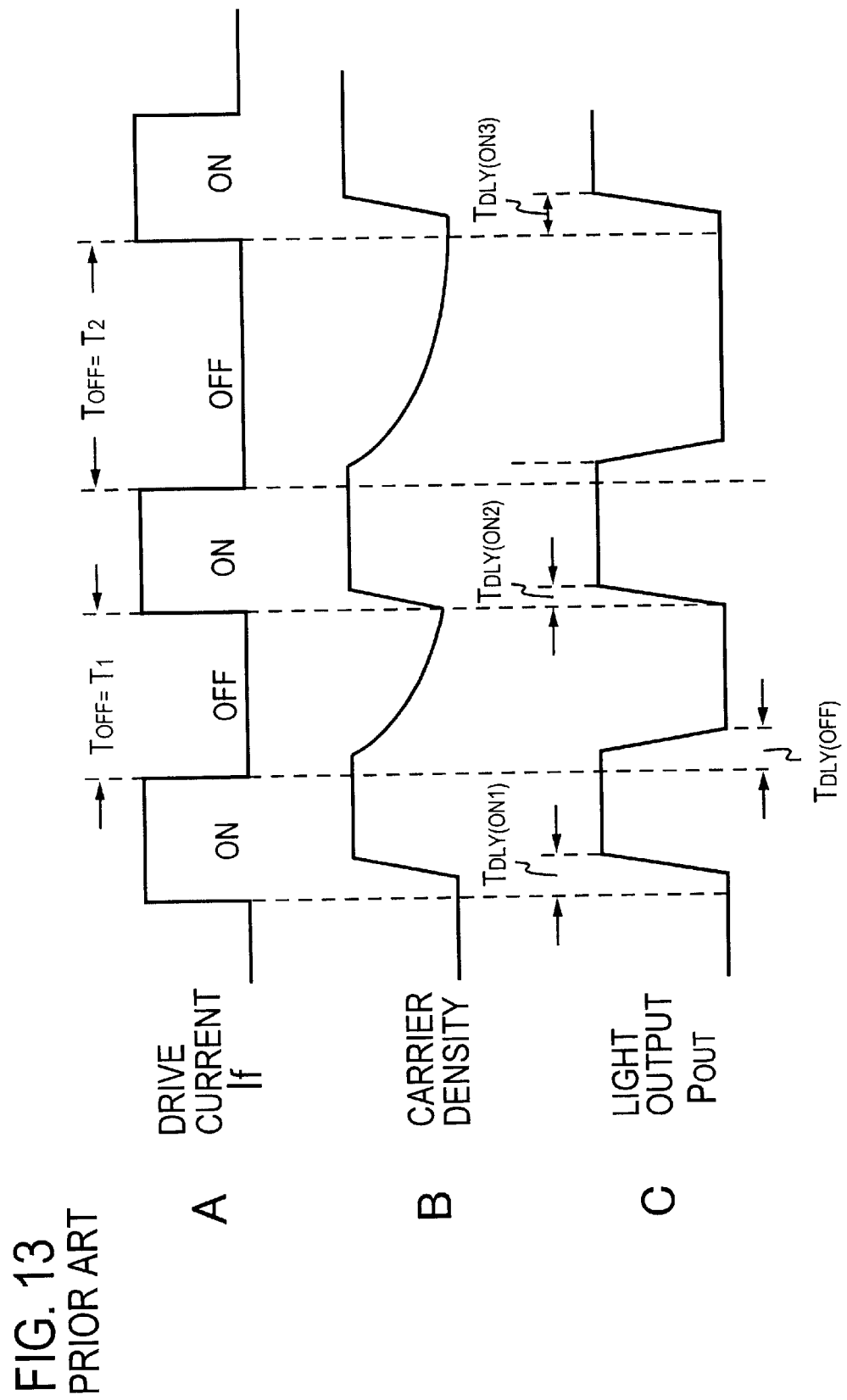
FIG. 13 is a series of waveform diagrams illustrating a disadvantage of the prior art.
Figure 14:
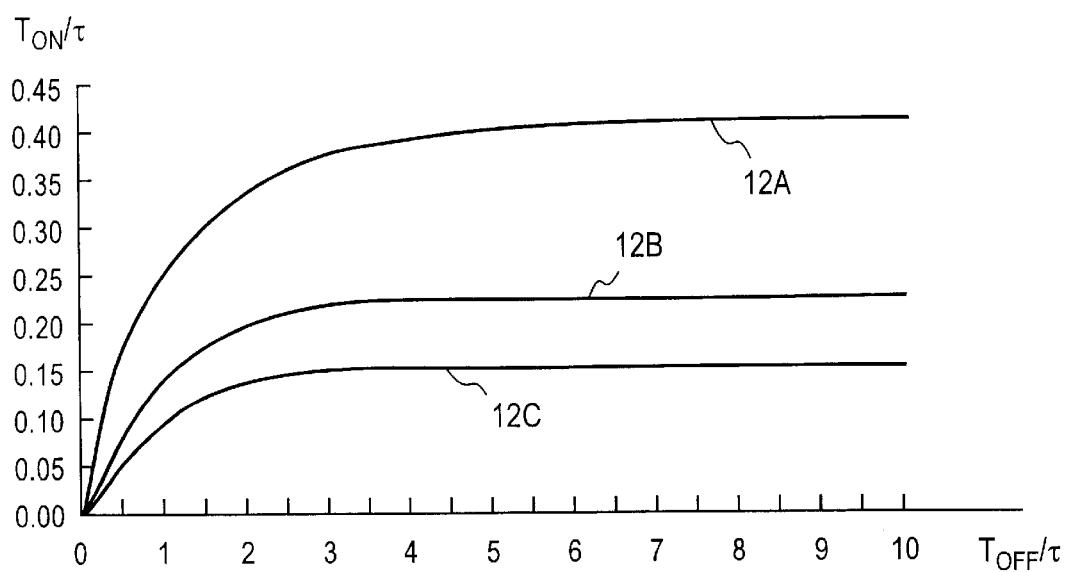
FIG. 14 graphically shows a relationship between the extinction period and turn-on time.

Referring to FIG. 1, a method and an apparatus for driving a laser according to one embodiment of the invention will be described. It should be noted that similar parts as those shown in FIG. 11 are designated by same reference characters in FIG. 1 as used in the description of FIG. 11. The present invention is characterized by the provision of a time measuring unit 11 which measures the length of time which elapsed since the interruption of a drive current, and a current controller 12 which controls a rising of a next drive current in a manner such that the shorter the length of time measured by the time measuring unit 11, the longer it takes for the next drive current to rise. The embodiment of FIG. 1 controls the turn-on time $T_{ON}$ of the laser diode by controlling the current Im appearing in the equation (1).

In the example shown in FIG. 1, the time measuring unit 11 determines the lapse of time since the falling edge of a drive signal $V_{IN}$ through a time constant circuit TMC, and an arrangement is illustrated here in which the shorter the OFF interval to a next rising, the less the magnitude of an amount by which the next rising driving current exceeds the emission initiating current Ith is restricted for a given interval by the current controller 12.

A drive signal $V_{IN}$ as shown in FIG. 2A is input to the time constant circuit TMC from an input terminal $T_{IN}$ through a delay element DLY and a buffer amplifier BUF. The time constant circuit TMC includes a resistor R, and a voltage VH of H-logic representing a drive signal $V_{IN}$ is applied to one end of the resistor R. The time constant circuit TMC also includes a capacitor C, and a junction A between the capacitor C and the resistor R of the time constant circuit TMC is connected to the anode of a diode D, the cathode of which is supplied with VH–Vf where Vf represents a forward voltage across the diode D. Accordingly, when the drive signal $V_{IN}$ rises to H-logic, a voltage at the junction A rises in retarded relationship by a delay time $T_{DY}$ produced by the delay element DLY, as shown in FIG. 2B, thus clipping the voltage $V_A$ at the junction A at voltage level VH as it tends to exceed the voltage level VH. Accordingly, a differentiated waveform of positive polarity, shown in dotted lines in FIG. 2B, which is developed across the resistor R is removed.

The current controller 12 may comprise a transistor $Q_3$ having its collector connected to the common emitter junction of the pair of transistors $Q_1$ and $Q_2$ which are turned on and off in a differential manner. The transistor $Q_3$ has a base, to which a given forward bias voltage Vcont from a bias voltage source 9 is applied through an adder ADD. In addition, a time signal of a negative polarity –Vdt (reverse bias voltage) which is generated by the time measuring unit 11 at the falling edge of the drive signal $V_{IN}$ is also applied to the adder ADD so that the shorter the length of time elapsed since the interruption of the previous current, the greater the magnitude of a reverse bias voltage (time signal –Vdt) applied to the current controller 12 at the rising edge of the drive signal $V_{IN}$, as shown in FIG. 2B.

Figure 2:
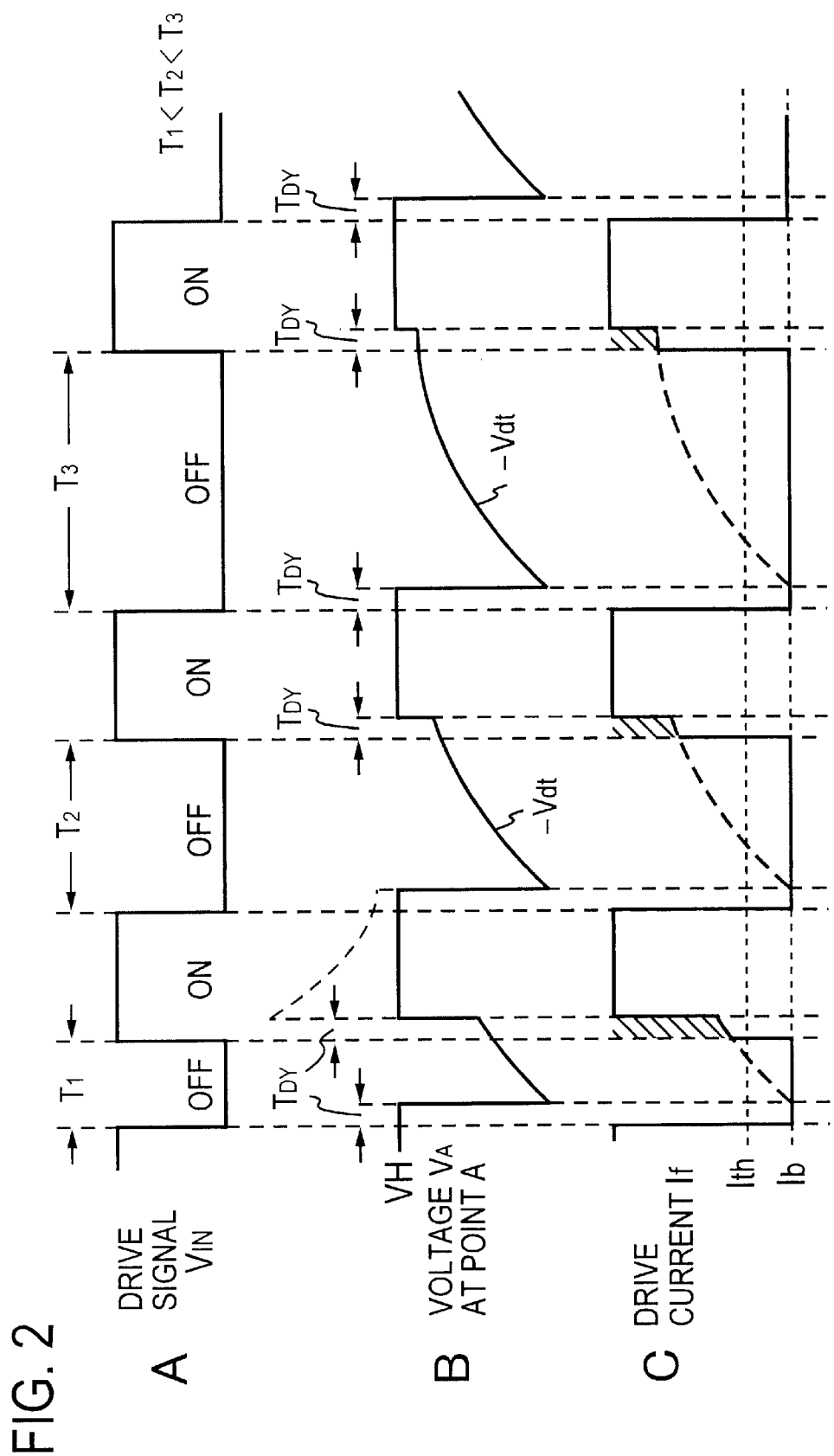
FIG. 2 is a series of timing charts illustrating the operation of the embodiment of FIG. 1.

In the embodiment of FIG. 1, as the drive signal $V_{IN}$ falls, the voltage at the junction A is biased in the negative direction as referenced to VH (which will be hereafter referred to as "a reverse bias") with a delay time $T_{DY}$ produced by the delay element DLY, beginning to charge the capacitor C through the resistor R in the opposite sense from the previous operation. Accordingly, the reverse bias voltage –Vdt applied to the junction A decreases with a time constant determined by RC, allowing the voltage $V_A$ to approach VH. It will be seen from FIG. 2 that the shorter the OFF interval of the drive signal $V_{IN}$, the greater the magnitude of the reverse bias voltage (a negative voltage as referenced to VH) which remains to be applied to the junction A at the time when the drive signal $V_{IN}$ rises for the next time. As a consequence, it will be noted from FIG. 2C that the magnitude of an amount by which the drive current If exceeds the emission initiating current Ith at the time when the drive current $V_{IN}$ rises is reduced in a corresponding manner, and because the voltage $V_A$ at the junction A rises with the delay time $T_{DY}$ from this point in time, it follows that an amount of carriers injected into the active layer of the laser diode by the time the drive current If rises to the maximum current is reduced in a corresponding manner. A product of the magnitude of the reverse bias voltage −Vdt applied to the junction A at the rising time of the drive signal $V_{IN}$ and the interval $T_{DY}$ during which the bias is applied, which is shown in FIG. 2C as an area of a hatched area, represents an amount of carrier injection suppressed by the arrangement of the invention, or an amount of carrier injection which would take place during the interval $T_{DY}$ if the drive current If is allowed to rise at the same time as the rising edge of the drive signal $V_{IN}$. It will be seen that the greater the amount of carrier injection thus suppressed, the longer the time until the laser diode LD is actually driven into oscillation. Consequently, in the example illustrated in FIG. 2C, the amount of carrier injection suppressed at the rising edge of the drive signal which immediately follows the OFF interval, and hence the delay time until the emission, is the greatest for the OFF interval $T_1$, and then sequentially decreases for the OFF intervals $T_2$ and $T_3$.

When a choice is made in the equation (1) given above so that the following equality:

$$(Im - Ith) = Id = k[1 - \exp(-T_{OFF}/\tau)] \quad (2)$$

applies where k represents a constant of proportionality, the turn-on time $T_{ON}$ can be made to be constant. Accordingly, the time constant $R \cdot C = \tau$ of the time constant circuit TMC is chosen to be substantially equal to the lifetime $\tau$ of carriers in the active layer of the laser diode LD to be driven. Thus, when the time signal −Vdt returns to VH volt, it follows that the carrier concentration substantially reverts to 0. If the drive signal $V_{IN}$ then rises to its H-logic at this point in time, the current If which passes through the laser diode LD rises with a given rising time $T_{ON}$.

By contrast, if the drive signal $V_{IN}$ rises to its H-logic at the time when the length of time elapsed since the interruption of the previous drive current is short, a time signal −Vdt of a higher reverse bias is applied to the current controller 12, and the H-logic signal will be applied under this condition. This means that it takes a longer time for the current passing through the laser diode LD to rise to the emission initiating current Ith, as shown in FIG. 2C, thus retarding the timing when the light emission occurs from the laser diode LD by a length of time which corresponds to the contribution of any residual carrier concentration to accelerating the initiation of the light emission.

Accordingly, when the drive signal $V_{IN}$ have successive off times $T_1$, $T_2$ and $T_3$, which are related such that $T_1 < T_2 < T_3$, the length of time $T_{11}$, $T_{22}$ and $T_{33}$, which is required for the current If passing through the laser diode LD to reach the emission initiating current value Ith since the rising time of the drive signal $V_{IN}$ will be related such that $T_{11} > T_{22} > T_{33}$, as shown in FIG. 2C. In other words, the length of time from the inversion of the drive signal $V_{IN}$ to its H-logic until the drive current If actually exceeds the emission initiating current value Ith will be increasingly shorter when the off terms $T_1$, $T_2$ and $T_3$ are increasingly longer.

As a consequence, the timing when the light emission from the laser diode LD occurs can be made uniform if the off times of the laser diode LD are related such that $T_1 < T_2 < T_3$, allowing the laser diode to be driven into emission at substantially an equal timing from the rising edge of the drive signal $V_{IN}$. Where data is transmitted in accordance with a flashing operation of the laser diode LD, there is obtained an advantage that the occurrence of a jitter can be suppressed.

Figure 3:
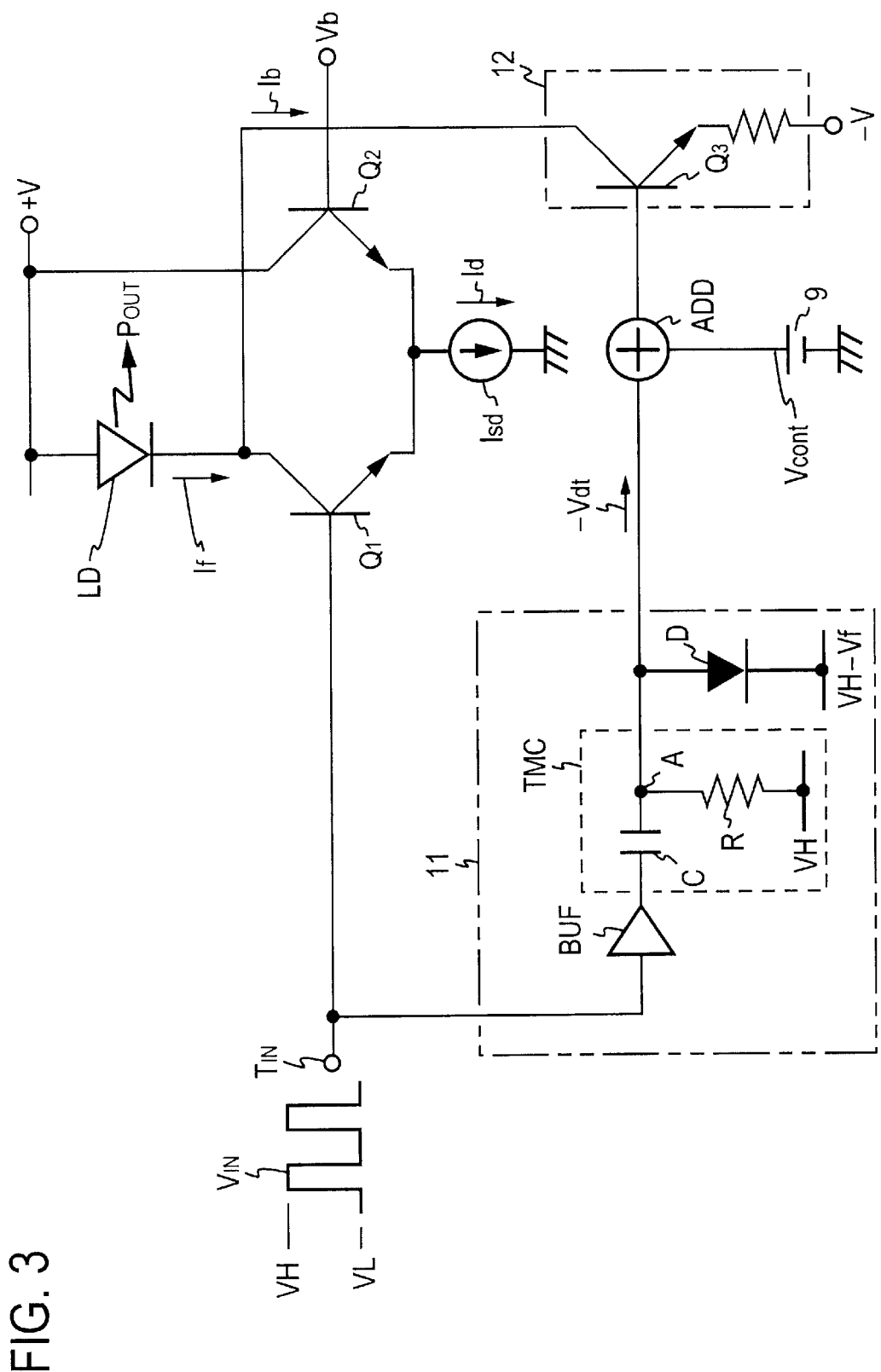
FIG. 3 is a circuit diagram illustrating a second embodiment of the invention.

FIG. 3 shows a second embodiment of the invention which is intended to provide a constant turn-on time $T_{ON}$ by controlling the bias current Ib which appears in the equation (1). In this embodiment, a current controller 12 is provided as a current source which supplies a bias current Ib to the laser diode LD, and comprises a transistor $Q_3$, the current flow Ib through which is controlled in accordance with the time signal −Vdt which is determined by the time measuring unit 11. However, it is to be noted that there is no element which corresponds to the delay element DLY in the time measuring unit 11 shown in the embodiment of FIG. 1. In addition, the emitters of the transistors $Q_1$ and $Q_2$ in the differential connection are connected in common to a constant current source Isd which provides a current Id. In other respects the arrangement is similar to the embodiment shown in FIG. 1.

Figure 4:
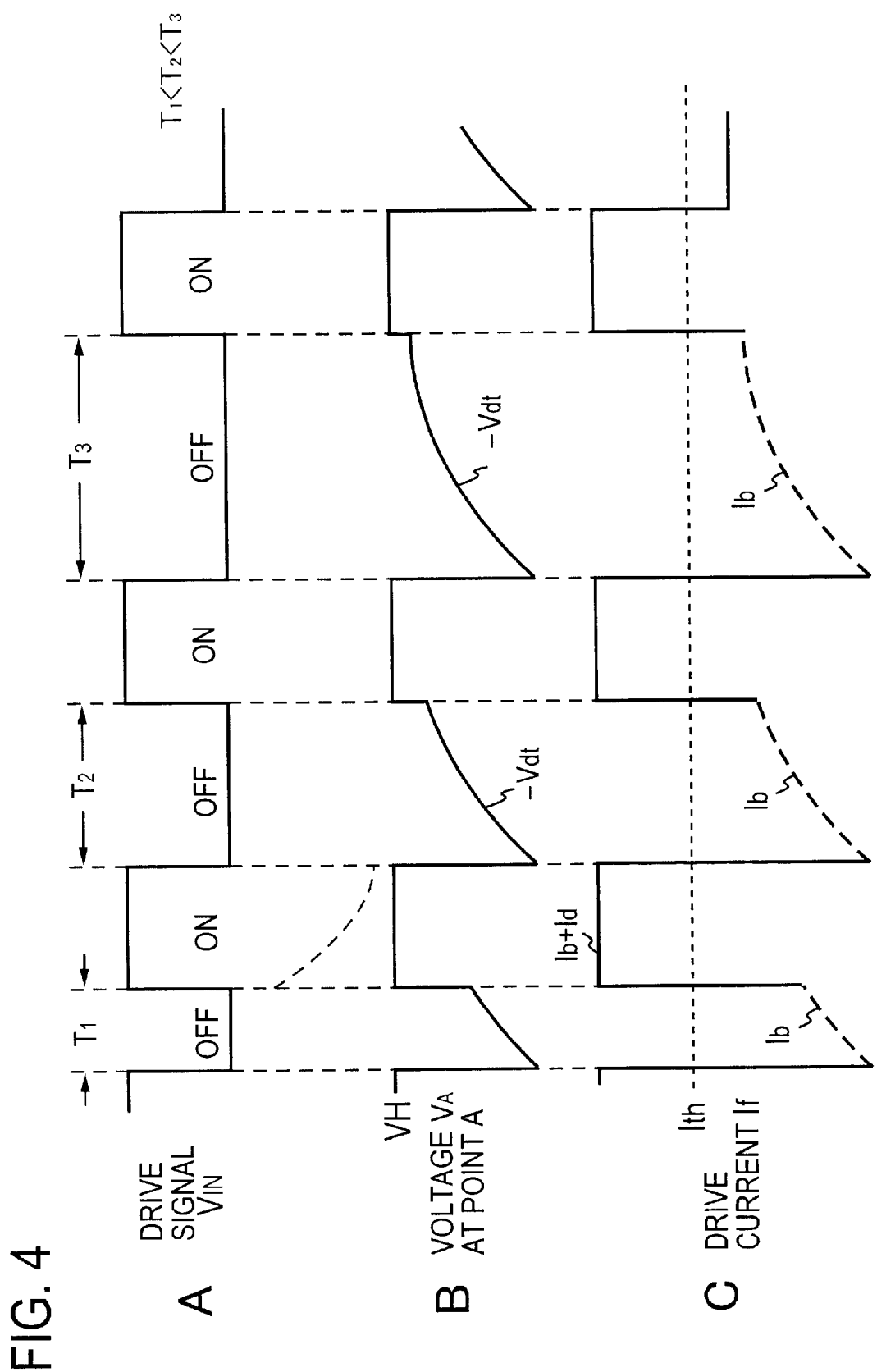
FIG. 4 is a series of timing charts illustrating the operation of the embodiment of FIG. 3.

It will be noted from FIG. 4B that the waveform of the voltage $V_A$ at the junction A does not contain a delay $T_{DY}$, as illustrated in FIG. 2B, at the time the drive signal $V_{IN}$ is applied as shown in FIG. 4A. Accordingly, the drive current If rises at the same timing as the drive signal $V_{IN}$ rises, as indicated in FIG. 4C. For each of the OFF intervals $T_1$, $T_2$ and $T_3$, the time signal −Vdt is applied to the base of the transistor $Q_3$ in the current controller 12 through an adder ADD as a reverse bias voltage which decreases with a time constant CR, as indicated in FIG. 4B.

The shorter the length of time since the interruption of the drive current If passing through the laser diode LD, the greater the bias voltage which is applied to the base of the transistor $Q_3$ as shown in FIG. 2B, and accordingly, if the drive signal $V_{IN}$ reverts to its H-logic in a shorter interval since the falling edge thereof to its L-logic, it will be seen that the bias current Ib which is applied as the drive current If during the OFF interval rises from a small value, as shown in FIG. 4C. It will be apparent from the equation (1) given above that if the H-logic of the drive signal $V_{IN}$ provides the drive current Im=Ib+Id of a given magnitude, it takes a longer turn-on time $T_{ON}$ for the laser diode when the bias current Ib has a small magnitude, thus retarding the time when the oscillation is entered.

When the drive signal $V_{IN}$ reverts to its H-logic at a timing when a length of time on the order of the lifetime $\tau$ of carriers in the active layer of the laser diode LD or longer has passed since the interruption of the drive current If through the laser diode LD, it will be seen that the time signal −Vdt delivered from the time measuring unit 11 is approaching VH volt or has already reached VH volt, and this means that the high bias current Ib is already passing through the laser diode, and accordingly, the laser diode is driven into oscillation in a reduced length of time in response to the reversion of the drive signal $V_{IN}$ to its H-logic.

Figure 5:
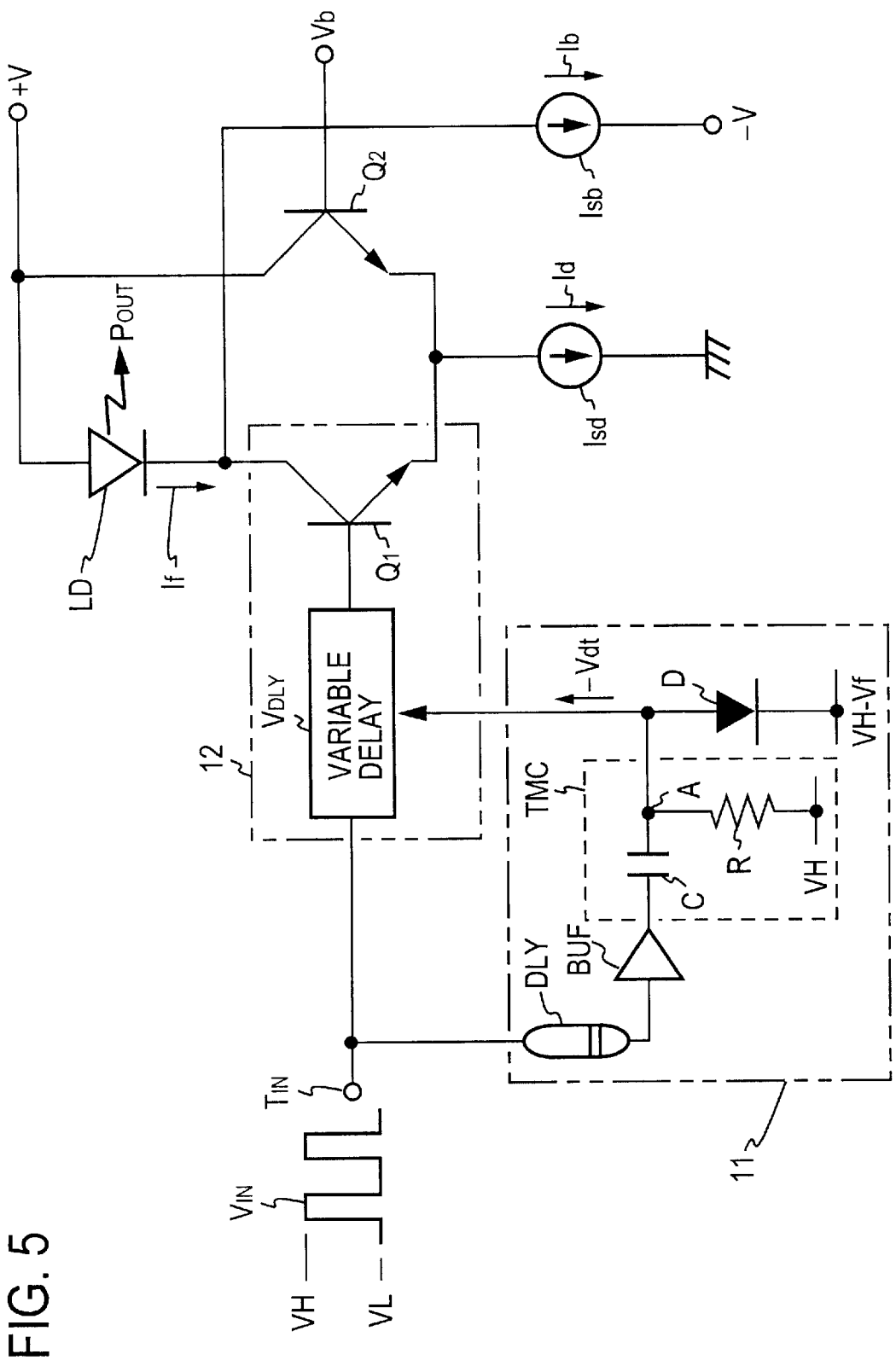
FIG. 5 is a circuit diagram illustrating a third embodiment of the invention.

FIG. 5 shows a third embodiment of the invention which is intended to control the turn-on time $T_{ON}$ by controlling the OFF interval of the drive signal which is applied to the transistor $Q_1$ actually driving the laser diode in accordance with the length of the OFF interval of the input drive signal $V_{IN}$ as if appears in the equation (1). In this embodiment, the current controller 12 shown in FIG. 1 is replaced by a fixed current source Isd as shown in FIG. 3, and a variable delay circuit $V_{DLY}$ is connected between the base of the transistor $Q_1$ and the input terminal $T_{IN}$ so that the combination of the variable delay circuit $V_{DLY}$ and the transistor $Q_1$ constitutes together a current controller 12. By controlling a delay time provided by the variable delay circuit $V_{DLY}$ by a time signal −Vdt delivered from the time measuring unit 11, a delay time for the drive signal $V_{IN}$ to be transmitted from the input terminal $T_{IN}$ to the base of the transistor $Q_1$ can be controlled.

Figure 6:
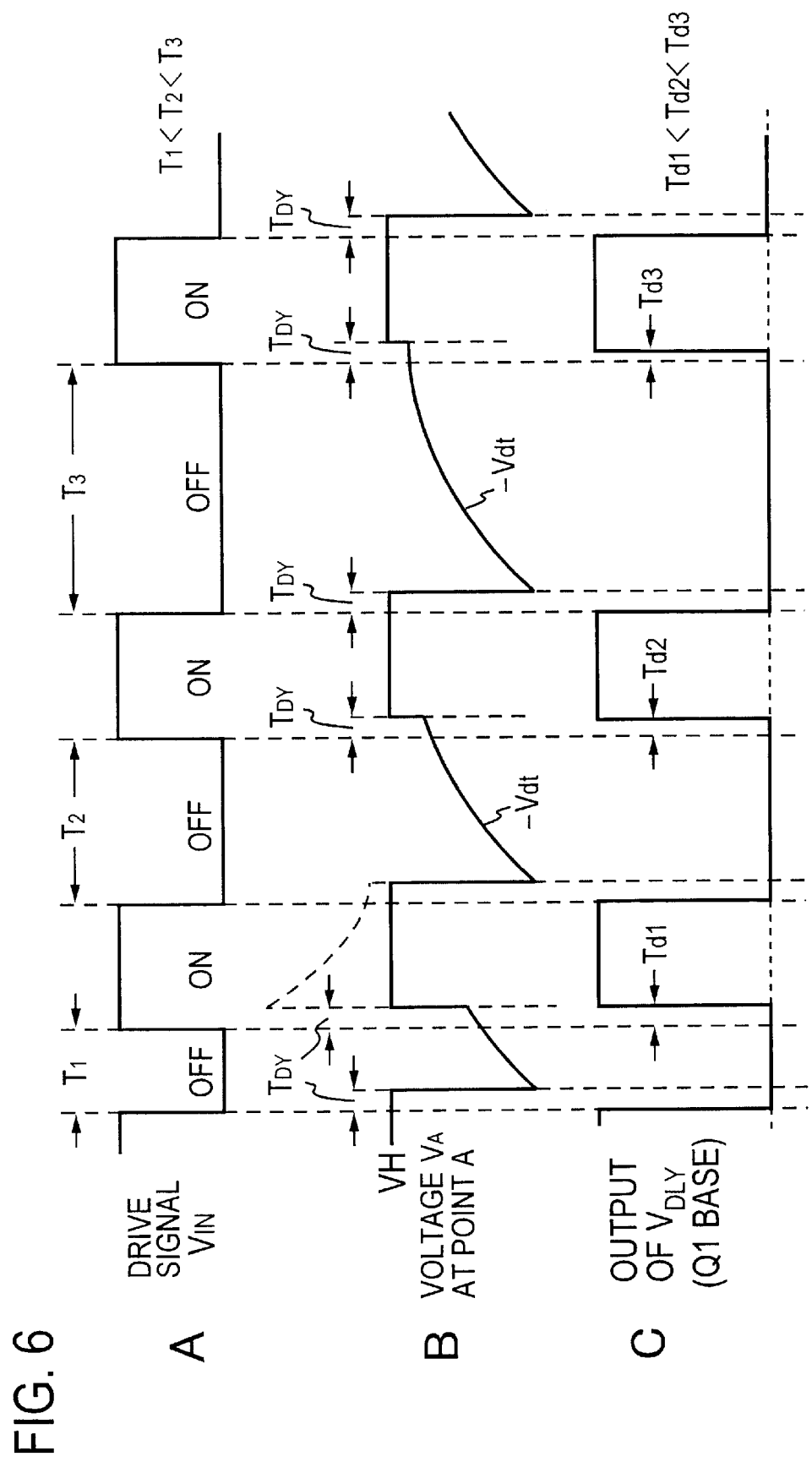
FIG. 6 is series of timing charts illustrating the operation of the embodiment shown in FIG. 5.

The time measuring unit 11 is constructed in the similar manner as in FIG. 1, and accordingly, the voltage $V_A$ at the junction A represents a negative differentiated waveform with a time delay Td provided by the delay element DLY with respect to the input drive signal VIN shown in FIG. 6A, in the similar manner as shown in FIG. 2B. The delay time Td of the variable delay circuit $V_{DLY}$ is controlled in a manner such that the greater the absolute magnitude of the time signal −Vdt in the negative direction, the longer the delay time. Accordingly, an output voltage from the variable delay circuit $V_{DLY}$ or an input base voltage of the transistor $Q_1$ is such that its rising time, which corresponds to the rising edge of the drive signal, is delayed by an interval Td which corresponds to the value of the time signal −Vdt which prevails at the rising edge of the drive signal, even though its falling edge coincides with the falling edge of the drive signal $V_{IN}$, as illustrated in FIG. 6C. As a consequence, when the drive signal $V_{IN}$ has OFF intervals related such that $T_1 < T_2 < T_3$ as indicated in FIG. 6A, if follows that the negative voltage −Vdt at the end of the respective OFF interval (or at the rising edge of the drive signal) is sequentially smaller, and accordingly, the delay time provided by the variable delay circuit $V_{DLY}$ for the rising edge of the drive signal is also sequentially smaller, as indicated in FIG. 6C. Accordingly, if the drive signal $V_{IN}$ reverts to its H-logic in a short length of time from the interruption of drive current If passing through the laser diode LD, the time measuring unit 11 delivers the time signal −Vdt of a negative polarity and having a greater magnitude, whereby the variable delay circuit $V_{DLY}$ is controlled to increase the delay time, and thus the reversion of the drive signal $V_{IN}$ applied to the input terminal $T_{IN}$ to its H-logic undergoes a longer delay before it is transmitted to the base of the transistor $Q_1$. As a consequence, a rising of the drive current If through the transistor $Q_1$ is retarded, as is the light emission from the laser diode LD.

When the drive signal reverts to its H-logic at a timing when a time comparable to the lifetime τ of carriers in the active layer of the laser diode LD has passed since the interruption of the drive current If through the laser diode LD, the time signal −Vdt delivered from the time measuring unit 11 is nearly VH volt or has already reached the VH volt. Accordingly, in this instance, the delay time provided by the variable delay circuit $V_{DLY}$ is at its minimum, and the input applied to the input terminal $T_{IN}$ as a reversion to H-logic is transmitted with a small lag to the transistor $Q_1$, allowing the drive current If through the laser diode LD to rise with a small lag, and thus allowing the laser diode LD to be driven into light emission in a reduced length of time.

Figure 7:
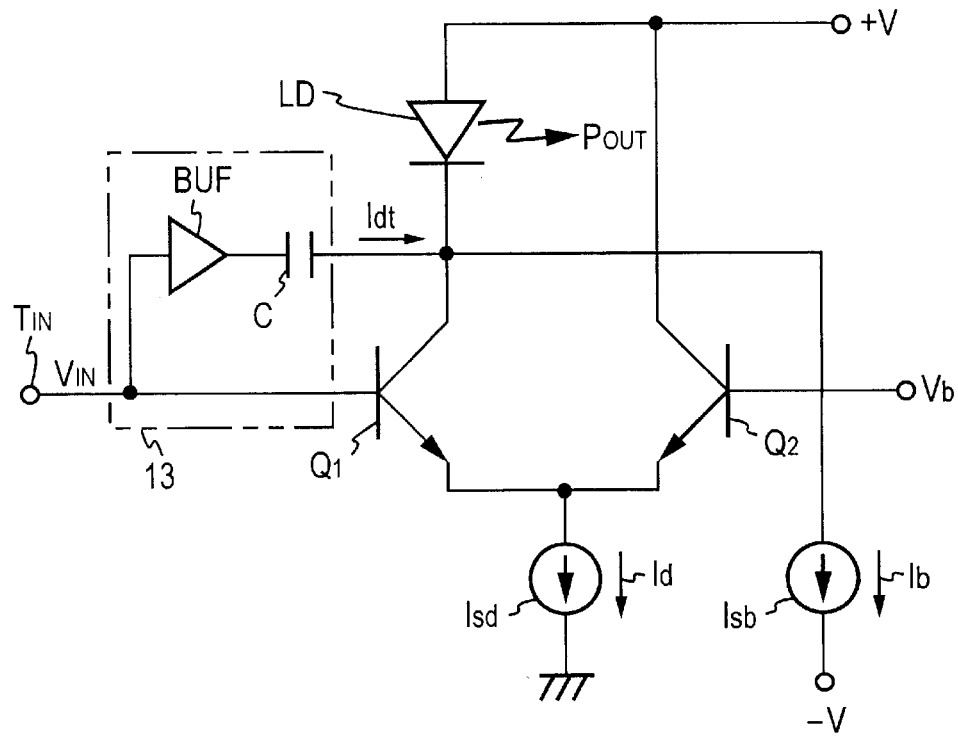
FIG. 7 is a circuit diagram illustrating a fourth embodiment of the invention.
Figure 8:
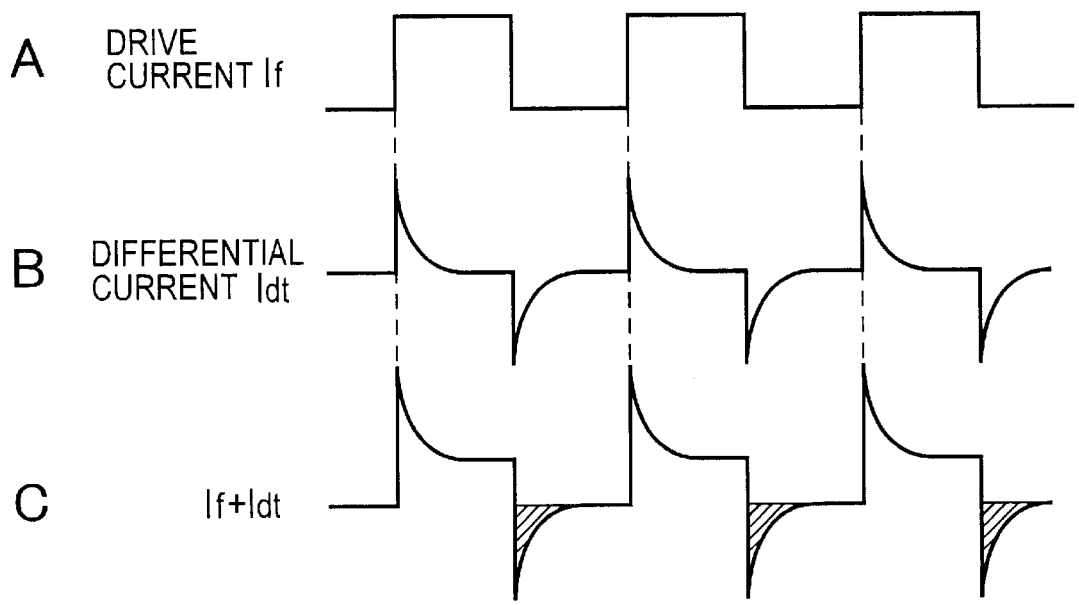
FIG. 8 is a series of waveform diagrams illustrating the operation of the embodiment shown in FIG. 7.

FIG. 7 shows a fourth embodiment of the apparatus for driving a laser diode according to the invention which controls the turn-on time $T_{ON}$ of the laser diode by controlling the drive current If=Im which appears in the equation (1) in the similar manner as the embodiment of FIG. 1, but in which unlike the embodiment of FIG. 1, a control current Idt is superimposed on the drive current If=Ib+Id. In this embodiment, there is provided a differential current generator 13 which differentiates the drive signal $V_{IN}$ to generate a differential current, which is then superimposed upon the drive current If through the laser diode LD. In the example shown in FIG. 7, the differential current derived from the drive current promotes the falling edge of the drive current If or is a reverse current to the laser diode LD at the time of extinction of the laser diode LD, thus contributing to rapidly reducing carriers which may be injected into the active layer of the laser diode LD. In the example shown in FIG. 7, the laser diode LD is driven in phase with the drive signal $V_{IN}$, and the differential current generator 13 comprises a buffer BUF and a capacitor C. Specifically, the buffer BUF generates a duplicate drive signal of the same polarity as the drive signal, which is applied to the capacitor C, thus charging and discharging the capacitor C to generate a differential current. In response to the drive current If shown in FIG. 8A, the generator 13 generates a differential current Idt shown in FIG. 8B, which is then superimposed upon the drive current If through the laser diode in a manner shown in FIG. 8C. When the positive differential current is superimposed on the rising drive current If, there is achieved the effect of reducing the turn-on time $T_{ON}$ by increasing the current Im as mentioned above in connection with FIG. 4. The differential current in a negative direction which is indicated in a region shown hatched is a reverse current with respect to the forward direction of the laser diode and is effective to reduce any residual carriers in the laser diode LD rapidly, thus allowing an influence of such residual carriers to be reduced from the next rising of the drive current.

Figure 9:
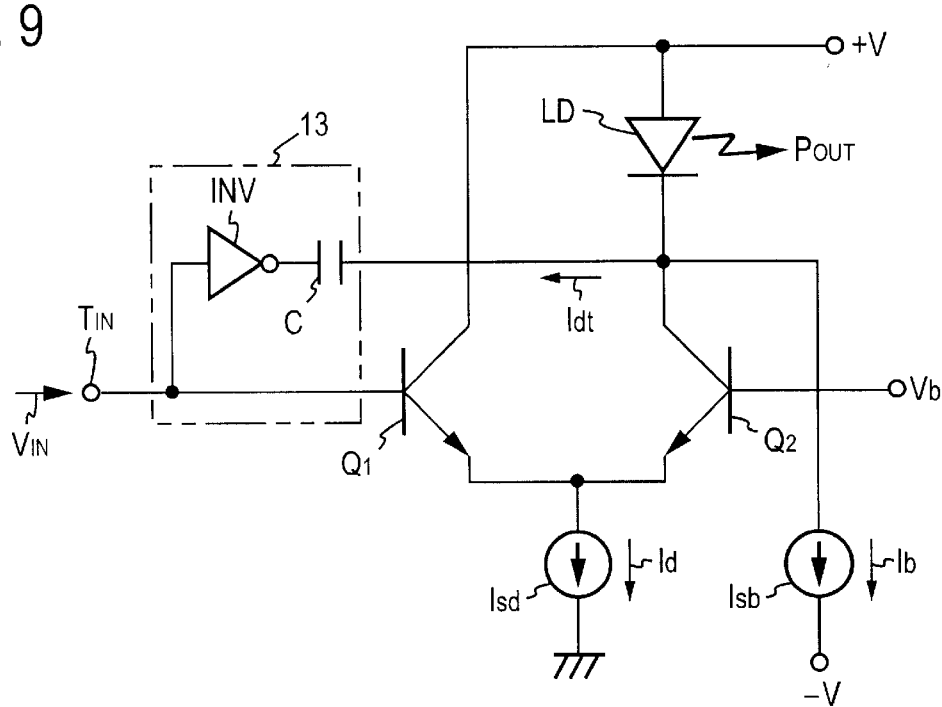
FIG. 9 is a circuit diagram showing a fifth embodiment of the invention.
Figure 10:
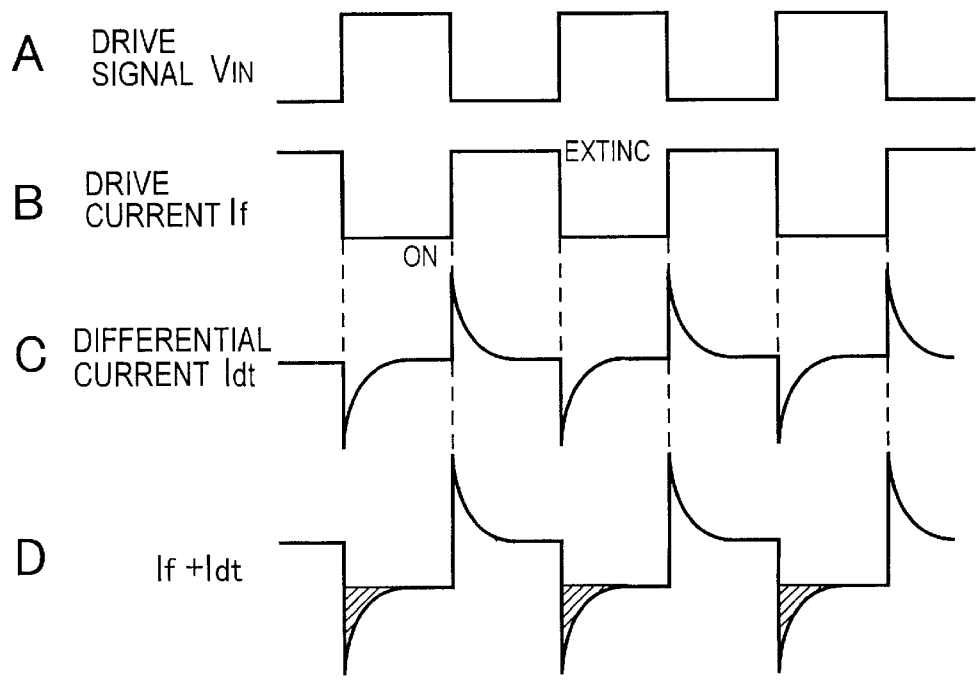
FIG. 10 is a series of waveform diagrams illustrating the operation of the embodiment shown in FIG. 9.

FIG. 9 shows a modification of the embodiment shown in FIG. 7 where the laser diode LD is driven in opposite phase to the drive signal $V_{IN}$. In this instance, a differential current generator 13 comprises a cascade connection of an inverter INV and a capacitor C. The inverter INV generates a duplicate drive signal of the opposite polarity from the drive signal, which is applied to the capacitor C to cause a charging and a discharging of the capacitor to generate a differential current. The drive current $V_{IN}$, as shown in FIG. 10A, is supplied to the cascade connection of the inverter INV and the capacitor C, and a differential current Idt as shown in FIG. 10C is derived at its output and is superimposed upon the drive current If, shown in FIG. 10B of the laser diode LD, as indicated in FIG. 10D.

Again, the differential current which represent a reverse flow with respect to the laser diode LD reduces residual carriers in the laser diode LD, which then operates to reach a light emission with a given time interval from the rising edge of the drive current If independently from the off time of the laser diode LD.

In the embodiments shown in FIGS. 7 and 9, a positive differential current is also superimposed, providing an advantage that the length of time until the light emission from the laser diode can be initiated can be reduced.

EFFECTS OF THE INVENTION

As discussed above, in accordance with the invention, a jitter which may occur on an optical pulse can be eliminated by utilizing the characteristic of a laser diode that the timing of next light emission varies depending on the length of time elapsed since the extinction. As a consequence, the invention allows a high quality data transmission when it is applied to a high rate data transmission which utilizes optical pulses of a reduced pulse width. For example, it may be utilized in a data delivery and reception within an IC testing equipment with a great advantage.

What is claimed is:

1. An apparatus for driving a laser diode, comprising:
a laser diode;
power supply means for supplying a driving power to the laser diode;
switching means connected in series with the laser diode to control a drive current which passes through the laser diode in accordance with a drive signal which repeats an ON and an OFF interval to switch the laser diode between a light emission and an extinction;
time measuring means for measuring an OFF interval of the drive signal and delivering a time signal having a level which corresponds to the interval; and current control means for controlling the drive current in accordance with a control signal which corresponds to the time signal such that the shorter the interval, the longer the rising of the drive current is retarded.

2. An apparatus for driving a laser diode according to claim 1 in which the current control means includes a current controlling transistor connected in series with the switching means, the current controlling transistor being fed with a control signal which corresponds to the time signal measured by the time measuring means and having a control terminal which controls the drive current.

3. An apparatus for driving a laser diode according to claim 2 in which the switching means comprises:
   a first switching transistor having a first collector connected to the laser diode, a first emitter connected to the current control means and a first base which is fed with the drive signal;
   a second switching transistor having a second collector connected to the power supply means, a second emitter connected to the first emitter of the first transistor and a second base to which a given bias voltage is applied;
   and a bias current source for normally supplying an emission initiating signal as a bias current to the laser diode.

4. An apparatus for driving a laser diode according to claim 3 in which the time measuring means comprises a delay element for delaying the drive signal by a predetermined time interval, a differentiator circuit having a predetermined time constant for producing a differential signal from the delayed drive signal, a clipping circuit for clipping one polarity of the differential signal while providing the differential signal of the other polarity which corresponds to the length of the OFF interval of the drive signal as the time signal, and adder means for adding a predetermined fixed bias voltage to the time signal to provide the control signal applied to the current control means.

5. An apparatus for driving a laser diode according to claim 1 in which the current control means includes a bias current source which is connected to the junction between the laser diode and the switching means for supplying a variable bias current to the laser diode in response to a voltage which corresponds to the time signal measured by the time measuring means.

6. An apparatus for driving a laser diode according to claim 5 in which the switching means comprises:
   a constant current source;
   a first switching transistor having a first collector connected to the laser diode, a first emitter connected to the constant current source and a first base to which the drive signal is applied; and
   a second switching transistor having a second collector connected to the power supply means, a second emitter connected to the first emitter of the first transistor and a second base to which a given bias voltage is applied.

7. An apparatus for driving a laser diode according to claim 6 in which the time measuring means comprises a differentiator circuit having a predetermined time constant and for generating a differential signal from the drive signal, a clipping circuit for clipping one polarity of the differential signal while providing the differential signal of the other polarity which corresponds to the length of the OFF interval of the drive signal to the laser diode as the time signal, and adder means for adding a predetermined given bias voltage to the time signal to provide a control signal applied to the current control means.

8. An apparatus for driving a laser diode according to claim 4 or 7 in which the time constant of the differentiator circuit is substantially equal to the lifetime of carriers in the laser diode.

9. An apparatus for driving a laser diode according to claim 1 in which the current control means comprises a variable delay circuit to which the drive signal is input and which produces a delay of a magnitude which corresponds to the level of the time signal at the rising of an ON interval which immediately follows each OFF interval, thereby causing the switching means to be controlled in accordance with the delayed drive signal.

10. An apparatus for driving a laser diode according to claim 9 in which the switching means comprises:
    a constant current source;
    a first switching transistor having a first collector connected to the laser diode, a first emitter connected to the constant current source and a first base to which the delayed drive signal from the variable delay circuit is applied;
    a second switching transistor having a second collector connected to the power supply means, a second emitter connected to the first emitter of the first switching transistor and a second base to which a given bias voltage is applied; and
    a bias current source for normally supplying an emission initiating current as a bias current to the laser diode.

11. An apparatus for driving a laser diode according to claim 9 or 10 in which the time measuring means comprises a delay element for delaying the drive current by a predetermined time interval, a differentiator circuit having a predetermined time constant for producing a differential signal from the delayed drive signal, and a clipping circuit for clipping one polarity of the differential signal while providing the differential signal of the other polarity which corresponds to the length of the OFF interval of the drive signal to provide the time signal to be applied to the variable delay circuit.

12. An apparatus for driving a laser diode comprising:
    a laser diode;
    power supply means for supplying a driving power to the laser diode;
    switching means connected in series with the laser diode to control a drive current which passes through the laser diode in accordance with a drive signal to switch the laser diode between a light emission and an extinction; and
    differential current generating means for generating a differential current from the drive signal and applying it as a reverse differential current to the laser diode during the extinction of the laser diode.

13. An apparatus for driving a laser diode according to claim 12 in which the switching means comprises
    a constant current source;
    a first switching transistor having a first collector connected to the laser diode, a first emitter connected to the constant current source and a first base to which the drive signal is applied;
    a second switching transistor having a second collector connected to the power supply means, a second emitter connected to the first emitter of the first transistor and a second base to which a given bias voltage is applied; and
    a bias current source for normally supplying an emission initiating current as a bias current to the laser diode; and
    the differential current generating means including a buffer which is fed with the drive signal to produce a duplicate drive signal of the same polarity as the drive signal, and a capacitor connected between an output of the buffer and the first collector.

14. An apparatus for driving a laser diode according to claim 12 in which the switching means comprises a constant current source;

a first switching transistor having a first collector connected to the power supply means, a first emitter connected to the constant current source and a first base to which the drive signal is applied;

a second switching transistor having a second collector connected to the laser diode, a second emitter connected to the first emitter of the first transistor and a second base to which a given bias voltage is applied; and the differential current generating means including an inverter which is fed with the drive signal to produce a duplicate drive signal of the opposite polarity from the drive signal, and a capacitor connected between the output of the inverter and the second collector.

15. A method of driving a laser diode in which a drive current passing through a laser diode is turned on and off by switching means in accordance with a drive signal which repeats an ON and an OFF interval to switch the laser diode between a light emission and an extinction, comprising the steps of:

(a) measuring an OFF interval in the drive signal to generate a time signal of a level which corresponds to the extinction interval; and (b) controlling the drive current on the basis of the time signal such that the shorter the interval measured, the longer the a rising of the drive current is retarded.

16. A method of driving a laser diode in which a drive current passing through a laser diode is turned on and off by switching means in accordance with a drive signal to switch the laser diode between a light emission and an extinction, comprising the steps of:

(a) generating a differential current from the drive signal; and (b) superimposing the differential signal upon the drive current so that the differential current from the falling edge of the drive current is effective in reducing residual carriers.

* * * * *